(12) United States Patent
Takeda

(10) Patent No.: US 6,288,968 B1
(45) Date of Patent: Sep. 11, 2001

(54) SEMICONDUCTOR INTEGRATED CIRCUIT EXHIBITING IMPROVED HIGH SPEED PERFORMANCE WITHOUT WAIT TIME IN OPERATION

(75) Inventor: Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/429,481

(22) Filed: Oct. 29, 1999

(30) Foreign Application Priority Data

Oct. 30, 1998 (JP) .................................................. 10-309287

(51) Int. Cl.[7] ...................................................... G11C 8/00
(52) U.S. Cl. ...................................... 365/230.03; 365/233
(58) Field of Search .............................. 365/230.03, 233, 365/230.06

(56) References Cited

U.S. PATENT DOCUMENTS 5,894,448 * 4/1999 Amano ............................ 365/230.03
5,959,930 * 2/2000 Sakurai ........................... 365/230.03
6,032,222 * 2/2000 Moroo ............................ 365/230.03

* cited by examiner

*Primary Examiner*—A. Zarabian
(74) *Attorney, Agent, or Firm*—Young & Thompson

(57) ABSTRACT

The present invention provides a semiconductor integrated circuit having: a plurality of basic blocks, at least one of the basic blocks being selectively activated in accordance with at least two types of selective signals, and each of the plurality of basic blocks having at least a circuit block and at least a receiver circuit connected to the circuit block; and at least one of signal generator connected to the plurality of basic blocks for generating the at least two types of selective signals which individually include control signals having the same level in order to transmit the at least two types of selective signals to the receiver circuit in activated one of the basic blocks, wherein if the at least two types of selective signals which individually include the control signals are inputted into the receiver circuit with different timings, then the receiver circuit generates an output signal which remains to have the same level as the control signal included in a latest-inputted one of the at least two types of selective signals.

27 Claims, 13 Drawing Sheets

Receiver Circuit

Receiver Circuit

Output signal from receiver circuit responding to X and Y control signals transmitted without time delay.

Output signal from receiver circuit responding to X control signal transmitted without time delay and Y control signal with time delay.

Output signal from receiver circuit responding to Y control signal transmitted without time delay and X control signal with time delay.

SEMICONDUCTOR INTEGRATED CIRCUIT EXHIBITING IMPROVED HIGH SPEED PERFORMANCE WITHOUT WAIT TIME IN OPERATION

BACKGROUND OF THE INVENTION

The present invention relates to a semiconductor integrated circuit, and more particularly to a semiconductor integrated circuit having a plurality of basic blocks, at least one of which is selectively activated by first and second selective signals.

FIG. 1 is a diagram illustrative of a first conventional structure of a semiconductor integrated circuit having a plurality of basic blocks to be selectively activated by first and second selective signals. The first conventional structure of a semiconductor integrated circuit has an N×M array of basic blocks 101, at least one of which is selected so that the number "L" of control signals are transmitted to the selected basic block for controlling order and time differences for activation or inactivation to component blocks which form the selected basic block. First and second block selective decoders 102 ands 103 are provided which generate first and second block selective signals which are to be transmitted in X-direction and Y-direction.

The selection of the individual basic blocks 101 are accomplished as follows. Each of the basic blocks 101 receives both the first and second selective signals for activation or inactivation to accomplish AND-logic of the first and second selective signals. If the basic block 101 receives the both the first and second selective signals for activation, then the basic block 101 is activated. A control signal generator circuit 104 is provided which generates the number "L" of control signals which are to be transmitted to the activated basic block 101. The control signals are required to be activated for a time period which includes a time period of the activation of the first and second selective signals. The first and second selective signals were activated before the control signals have been activated, and then the control signals are inactivated and subsequently the first and second selective signals are inactivated.

FIG. 2 is a diagram illustrative of a second conventional structure of a semiconductor integrated circuit of a dynamic random access memory to explain a method of transmission of control signals. This second conventional structure is almost the same as the above first conventional structure. The following descriptions with reference to FIG. 2 is disclosed in JSSCC, vol. 28, No. 11, pp. 1092–1098. The second conventional structure of the dynamic random access memory has an N×M array of basic blocks 101, at least one of which is selected so that the number "L" of control signals are transmitted to the selected basic block for controlling order and time differences for activation or inactivation to component blocks which form the selected basic block. First and second selective signal generator circuits 102 and 103 are provided which generate first and second block selective signals which are to be transmitted in X-direction and Y-direction. If the activation signal to the sense amplifier is transmitted, the second selective signal generator circuit 103 is operated to activate block selective signals RSL0 and RSL1 to be transmitted on second lines 2 which extend in Y-direction. After a predetermined time has passed from the activation of the block selective signals RSL0 and RSL1, then the first selective signal generator circuit 102 is operated to activate block selective signals SSL0 and SSL1 to be transmitted on first lines 1 which extend in X-direction. A wait time is defined to be a time until the block selective signals SSL0 and SSL1 are activated after the block selective signals RSL0 and RSL1 have been activated. This wait time depends upon a time which is defined to be a time until activation of all of the basic blocks is completed after the activation to the block selective signals RSL0 and RSL1 has been commenced. Each of the above block selective signals SSL0 and SSL1 includes not only an information of selecting blocks in X-direction but also another information of controlling the activation to the sense amplifier. The block selective signals SSL0 and SSL1 are AND-logic signals of the signals of selecting blocks in X-direction and the signals of controlling the activation to the sense amplifier. Namely, the control signals are transmitted together with one of the block selective signals. The reason why the control signals are transmitted together with one of the block selective signals are to reduce the number of the necessary lines which vary in potential due to signal transmissions.

The above conventional structure has the following problems. The necessary wait time is increased by the increase in scale of the semiconductor integrated circuit, and further the increase in the necessary wait time also increase a latency and a cycle time. The increase in latency of the circuit due to the increase in the wait time will be described. At a time T0, the block selective signals to be transmitted in Y-direction are generated by the second selective decoder 103. A delay T1 in signal transmission on the line 1 extending in X-direction causes an extension of the necessary time for completion of transmissions of the block selective signals in Y-direction to all of the basic blocks. In order to complete transmission of the block selective signals to all of the basic blocks prior to the transmission of he control signals, at a time T0+T1 which is the sum of the above time T0 and the wait time T1, control signals to the basic blocks are outputted from the circuit 103 together with the block selective signals in Y-direction. Assuming that a delay time in transmission of the signals on the lines 2 is T2, the necessary time for completion of the transmission of the control signals to all of the basic blocks is T0+T1+T2. The wait time T1 and the delay time T2 depend upon the circuit scale and increase as the circuit scale creases.

The following descriptions will focus on the increase in the cycle time due to the increase in wait time. A time during which the basic blocks remain activated by the number "L" of the control signals is defined to be T3. Since the time of commencement of the activation to the control signals in the circuit 103 is T0+T1, the time of inactivation to all of the control signals in the circuit 103 is T0+T1+T3, and a time of completion of transmission of the inactivated control signals to all of the basic blocks is T0+T1+T2+T3, where the T2 is the delay in transmission of the line 2.

In all of the basic blocks, it is necessary to inactivate the block selective signals after the inactivated control signals have been transmitted, for which purpose, at the time of summing the wait time and the time T0+T1+T3 having just inactivated all of the control signals, or the time T0+T1+T2+T3, the block selective signals to be transmitted in Y-direction are inactivated.

It is permitted to activate the block selective signals to be transmitted in Y-direction in the next cycle but after the time T0+T1+T2+T3, for which reason the minimum cycle time is defined to be T1+T2+T3, wherein the wait times T1 and T2 depend on the circuit scale and increase as the circuit scale creases.

In the above circumstances, it had been required to develop a novel semiconductor integrated circuit free from the above problem.

SUMMARY OF THE INVENTION

Accordingly, it is an object of the present invention to provide a novel semiconductor integrated circuit free from the above problems.

It is a further object of the present invention to provide a novel semiconductor integrated circuit which exhibits improved high speed performances.

It is a still further object of the present invention to provide a novel semiconductor integrated circuit operable without any wait time.

It is yet a further object of the present invention to provide a novel.

The first present invention provides a semiconductor integrated circuit having: a plurality of basic blocks, at least one of the basic blocks being selectively activated in accordance with at least two types of selective signals, and each of the plurality of basic blocks having at least a circuit block and at least a receiver circuit connected to the circuit block; and at least one of signal generator connected to the plurality of basic blocks for generating the at least two types of selective signals which individually include control signals having the same level in order to transmit the at least two types of selective signals to the receiver circuit in activated one of the basic blocks, wherein if the at least two types of selective signals which individually include the control signals are inputted into the receiver circuit with different timings, then the receiver circuit generates an output signal which remains to have the same level as the control signal included in a latest-inputted one of the at least two types of selective signals.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
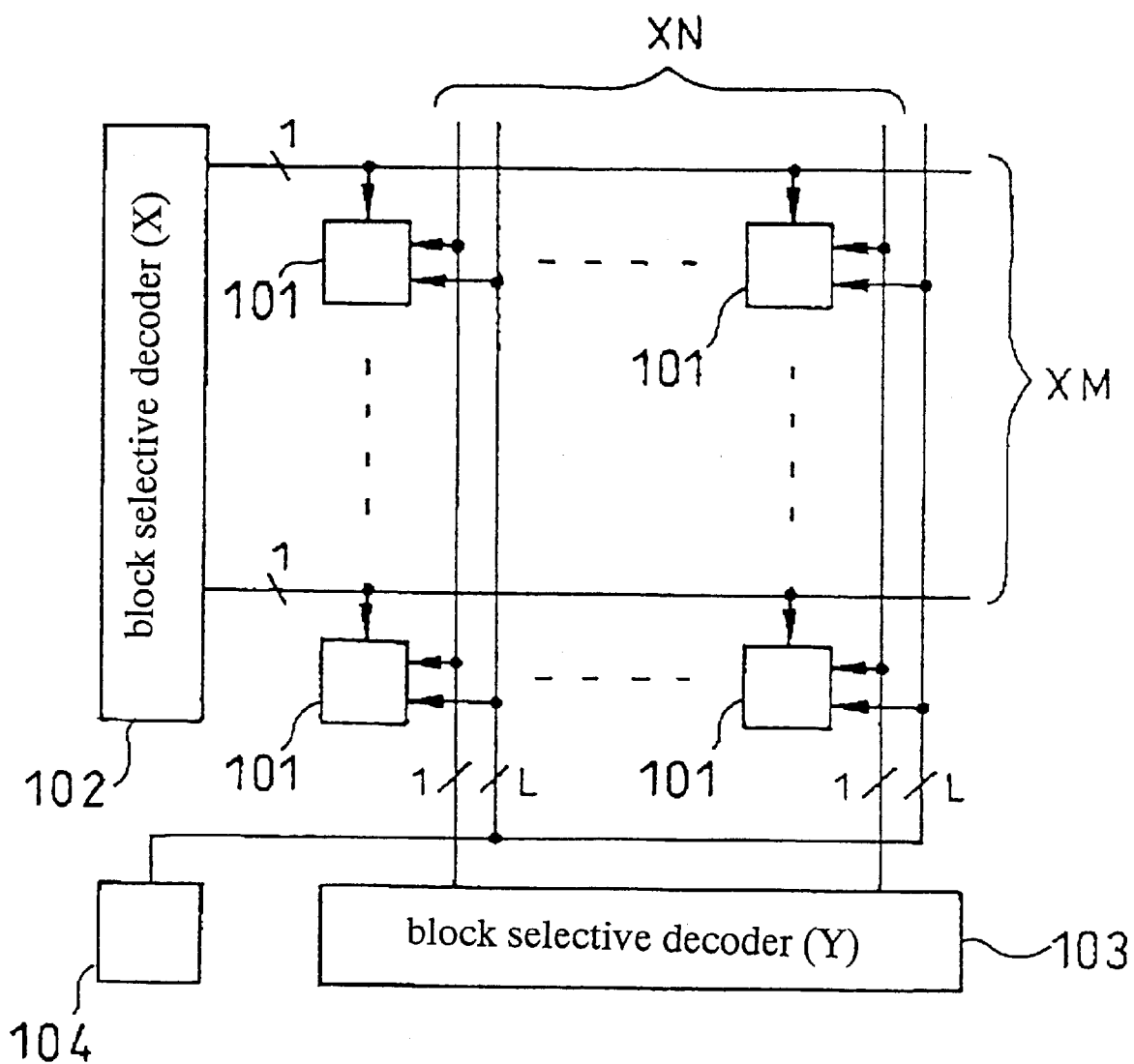
FIG. 1 is a diagram illustrative of a first conventional structure of a semiconductor integrated circuit having a plurality of basic blocks to be selectively activated by first and second selective signals.
Figure 2:
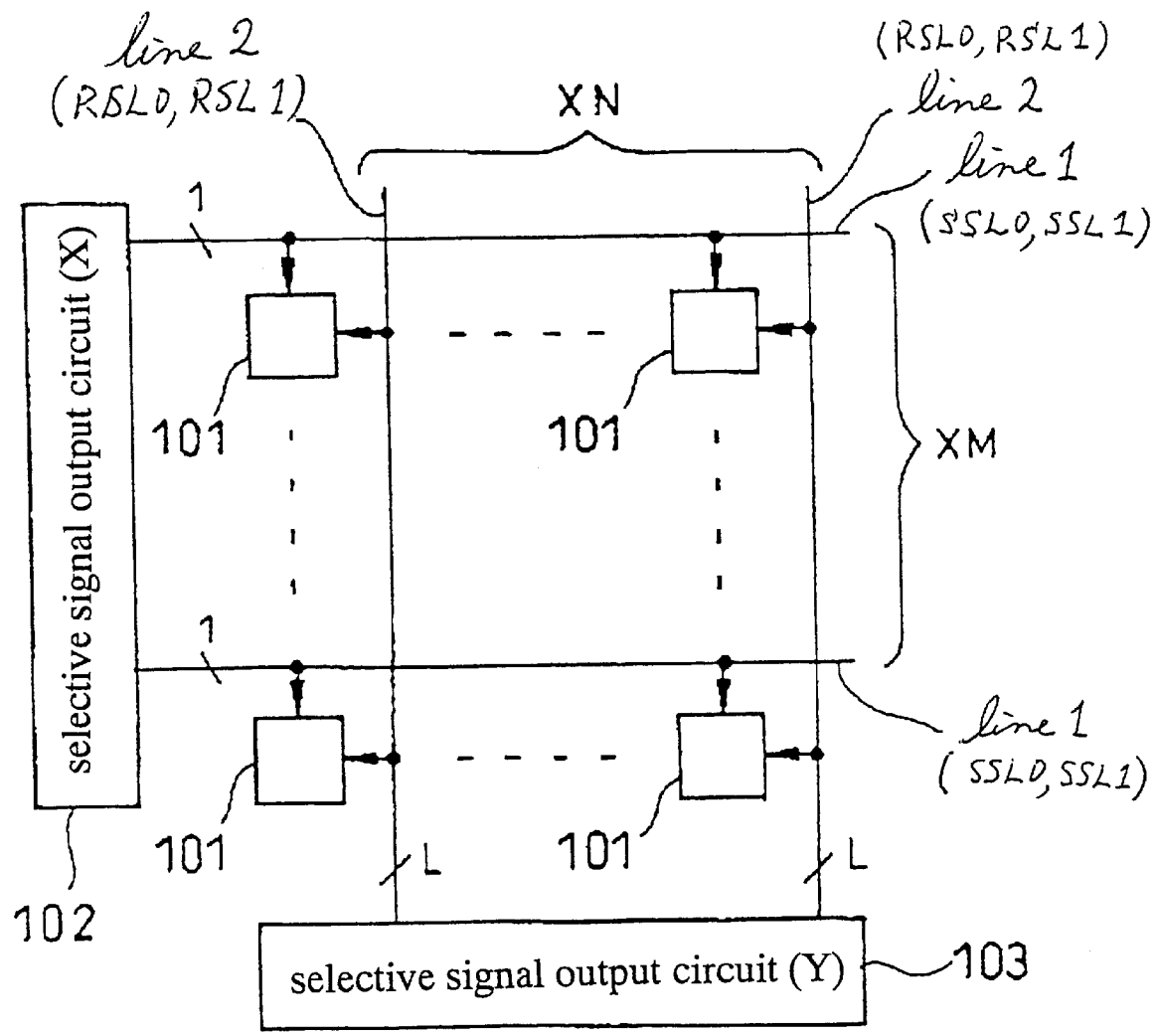
FIG. 2 is a diagram illustrative of a second conventional structure of a semiconductor integrated circuit of a dynamic random access memory to explain a method of transmission of control signals.

The first present invention provides a semiconductor integrated circuit having: a plurality of basic blocks, at least one of the basic blocks being selectively activated in accordance with at least two types of selective signals, and each of the plurality of basic blocks having at least a circuit block and at least a receiver circuit connected to the circuit block; and at least one of signal generator connected to the plurality of basic blocks for generating the at least two types of selective signals which individually include control signals having the same level in order to transmit the at least two types of selective signals to the receiver circuit in activated one of the basic blocks, wherein if the at least two types of selective signals which individually include the control signals are inputted into the receiver circuit with different timings, then the receiver circuit generates an output signal which remains to have the same level as the control signal included in a latest-inputted one of the at least two types of selective signals. Accordingly, the output signal from the receiver circuit depends upon the level of the control signal included in the mostly delay-transmitted selective signal having been inputted with the time delay. Therefore, the latency and the minimum cycle time period are reduced. The above receiver circuit enables the semiconductor integrated circuit to show an improved high speed performance without any necessary wait time in operation.

It is preferable that the at least two types of the selective signals including the control signals are the same as each other in number, and the receiver circuits connected to the circuit block are the same in number as the selective signals in each type, and each of the receiver circuits receives every types of the selective signals one by one.

It is further preferable that it is further preferable that the receiver circuits comprise are of flip-flop type logic circuits.

It is also preferable that a plurality of the signal generators are provided, and each of the signal generators comprises a control signal generator circuit for generating the control signal, a block selecting decoder circuit for generating the selective signal and an AND-logic circuit connected to the control signal generator circuit for receiving the control signal and also connected to the block selecting decoder circuit for receiving the selective signal so that the AND-logic circuit outputs an AND-operation result as the selective signal including the control signal.

It is also preferable that a plurality of the signal generators and a single common control signal generator for generating the control signal are provided, and each of the signal generators comprises a block selecting decoder circuit for generating the selective signal and an AND-logic circuit connected to the single common control signal generator circuit for receiving the control signal and also connected to the block selecting decoder circuit for receiving the selective signal so that the AND-logic circuit outputs an AND-operation result as the selective signal including the control signal.

It is also preferable that the semiconductor integrated circuit is a dynamic random access memory.

It is further preferable that each of the basic blocks includes at least a memory cell array and a sense amplifier connected to the memory cell array for amplifying data of the memory cell array, and the control signal includes a sense amplifier enable signal.

It is furthermore preferable that each of the basic blocks further includes a data output circuit connected to the sense amplifier for receiving amplified read data from the sense amplifier to output the amplified read data, and a date write circuit connected to the sense amplifier for transmitting write data to the sense amplifier, and the control signal further includes a read control signal and a write control signal.

It is moreover preferable that each of the basic blocks further includes a pre-charge circuit connected between the memory cell array and the sense amplifier for pre-charging bit lines of the memory cell arrays, and the control signal furthermore includes a pre-charge signal.

It is also preferable that the control signals comprise digital signals.

The second present invention provides a semiconductor integrated circuit having: a plurality of basic blocks, at least one of the basic blocks being selectively activated in accordance with at least two types of selective signals, and each of the plurality of basic blocks having at least a circuit block and at least a receiver circuit connected to the circuit block; and at least one of signal generator connected to the plurality of basic blocks for generating the at least two types of selective signals which individually include control signals having the same level in order to transmit the at least two types of selective signals to the receiver circuit in activated one of the basic blocks, wherein if the receiver circuit receives the at least two types of selective signals which individually include the control signals having the same level as each other, then the receiver circuit generates an output signal having the same level as the control signal, and if the receiver circuit receives the at least two types of selective signals which individually include the control signals having different levels from each other, then the receiver circuit generates the output signal having the same level as a previously received control signal. Accordingly, the output signal from the receiver circuit depends upon the level of the control signal included in the mostly delay-transmitted selective signal having been inputted with the time delay. Therefore, the latency and the minimum cycle time period are reduced. The above receiver circuit enables the semiconductor integrated circuit to show an improved high speed performance without any necessary wait time in operation.

It is preferable that the at least two types of the selective signals including the control signals are the same as each other in number, and the receiver circuits connected to the circuit block are the same in number as the selective signals in each type, and each of the receiver circuits receives every types of the selective signals one by one.

It is further preferable that the receiver circuits comprise are of flip-flop type logic circuits.

It is also preferable that a plurality of the signal generators are provided, and each of the signal generators comprises a control signal generator circuit for generating the control signal, a block selecting decoder circuit for generating the selective signal and an AND-logic circuit connected to the control signal generator circuit for receiving the control signal and also connected to the block selecting decoder circuit for receiving the selective signal so that the AND-logic circuit outputs an AND-operation result as the selective signal including the control signal.

It is also preferable that a plurality of the signal generators and a single common control signal generator for generating the control signal are provided, and each of the signal generators comprises a block selecting decoder circuit for generating the selective signal and an AND-logic circuit connected to the single common control signal generator circuit for receiving the control signal and also connected to the block selecting decoder circuit for receiving the selective signal so that the AND-logic circuit outputs an AND-operation result as the selective signal including the control signal.

It is also preferable that the semiconductor integrated circuit is a dynamic random access memory.

It is further preferable that each of the basic blocks includes at least a memory cell array and a sense amplifier connected to the memory cell array for amplifying data of the memory cell array, and the control signal includes a sense amplifier enable signal.

It is furthermore preferable that each of the basic blocks further includes a data output circuit connected to the sense amplifier for receiving amplified read data from the sense amplifier to output the amplified read data, and a date write circuit connected to the sense amplifier for transmitting write data to the sense amplifier, and the control signal further includes a read control signal and a write control signal.

It is moreover preferable that each of the basic blocks further includes a pre-charge circuit connected between the memory cell array and the sense amplifier for pre-charging bit lines of the memory cell arrays, and the control signal furthermore includes a pre-charge signal.

It is also preferable that the control signals comprise digital signals.

The present invention may be applicable to when the control signals are transmitted in not only two directions but also further directions.

PREFERRED EMBODIMENT

Figure 3:
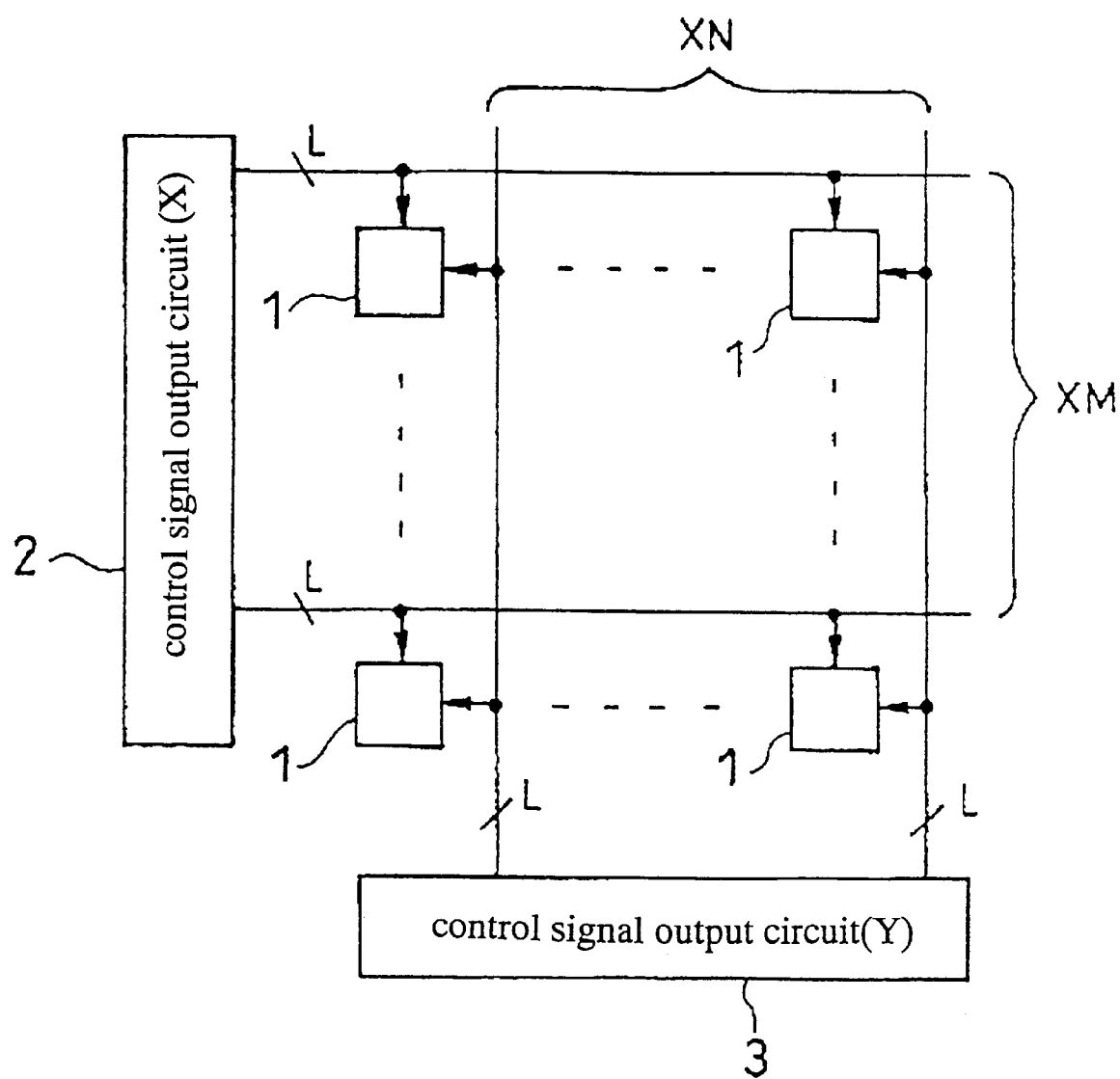
FIG. 3 is a diagram illustrative of a first novel structure of a semiconductor integrated circuit having a plurality of basic blocks to be selectively activated by first and second selective signals in a first embodiment in accordance with the present invention.

A first embodiment according to the present invention will be described in detail with reference to the drawings. FIG. 3 is a diagram illustrative of a first novel structure of a semiconductor integrated circuit having a plurality of basic blocks to be selectively activated by first and second selective signals in a first embodiment in accordance with the present invention. The first novel structure of the semiconductor integrated circuit has an N×M array of basic blocks 1 and first and second control signal output circuits 2 and 3. The first control signal output circuit 2 activates at least one of rows, the number of which is "M", in synchronizing with external clock signals CLK for transmitting the number "L" of first control signals to the activated basic blocks in X-direction. The second control signal output circuit 3 activates at least one of columns, the number of which is "N", in synchronizing with the external clock signals CLK for transmitting the number "L" of second control signals to the activated basic blocks in Y-direction.

Figure 4:
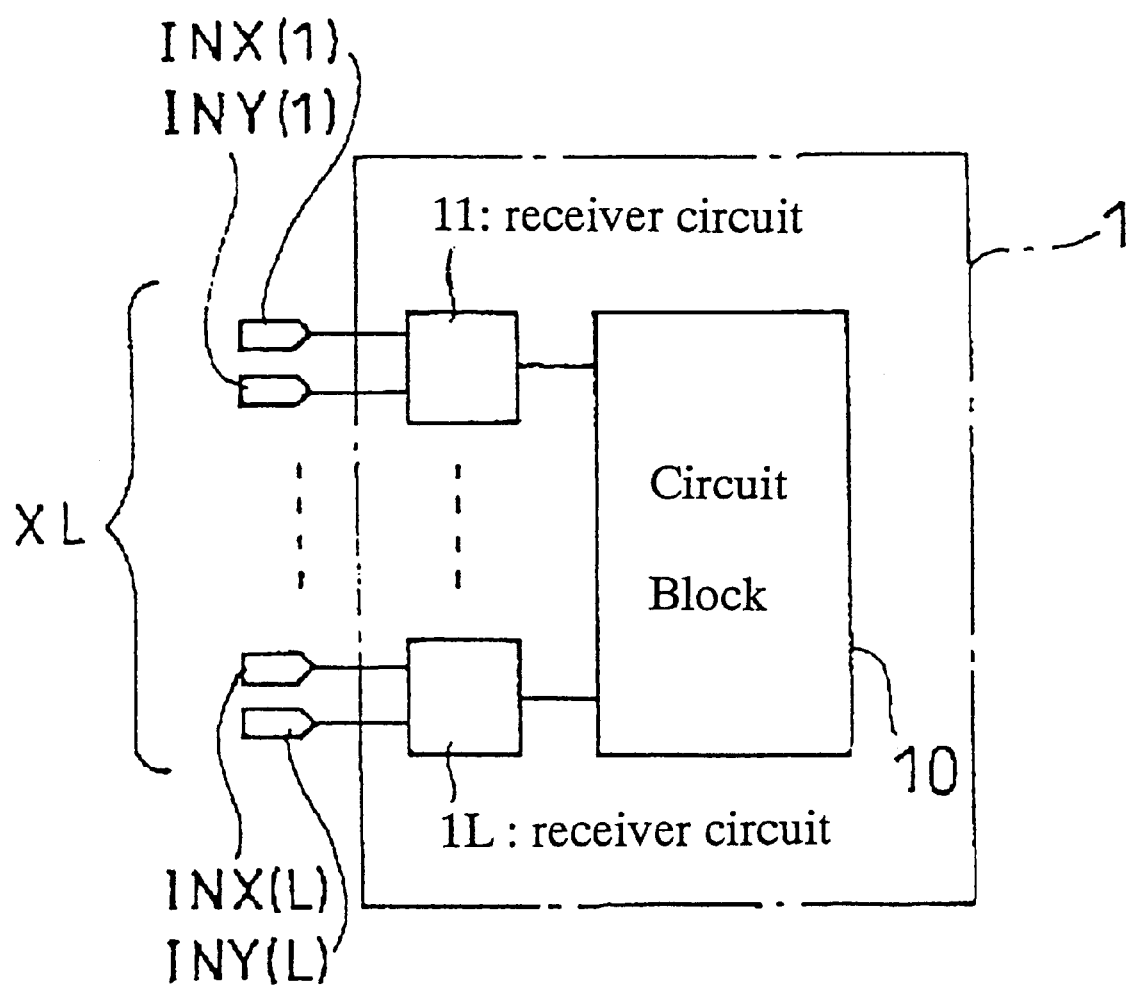
FIG. 4 is a block diagram illustrative of a structure of each of basic blocks aligned in matrix in a first novel semiconductor integrated circuit of FIG 3.

The present invention may be applicable to when the control signals are transmitted in not only the X-direction and Y-direction but also further directions, FIG. 4 is a block diagram illustrative of a structure of each of basic blocks aligned in matrix in a first novel semiconductor integrated circuit of FIG. 3. Each of the basic blocks 1 has a single circuit block 10 and the number "L" of receiver circuits 11, 12, - - - 1L connected to the circuit block 10. The first receiver circuit 11 is to receive control signals INX(1) and INY(1) transmitted in X-direction and Y-direction respectively. The receiver circuit 1L is to receive control signals INX(L) and INY(L) transmitted in X-direction and Y-direction respectively. Namely, the i-th receiver circuit 1i is to receive control signals INX(i) and INY(i) transmitted in X-direction and Y-direction respectively, wherein the control signals INX(i) and INY(i) are the same as each other. The receiver circuits comprise flip-flop circuits. The circuit block is controlled by the output signals from the receiver circuits 11, 12, - - - 1L.

Figure 5:
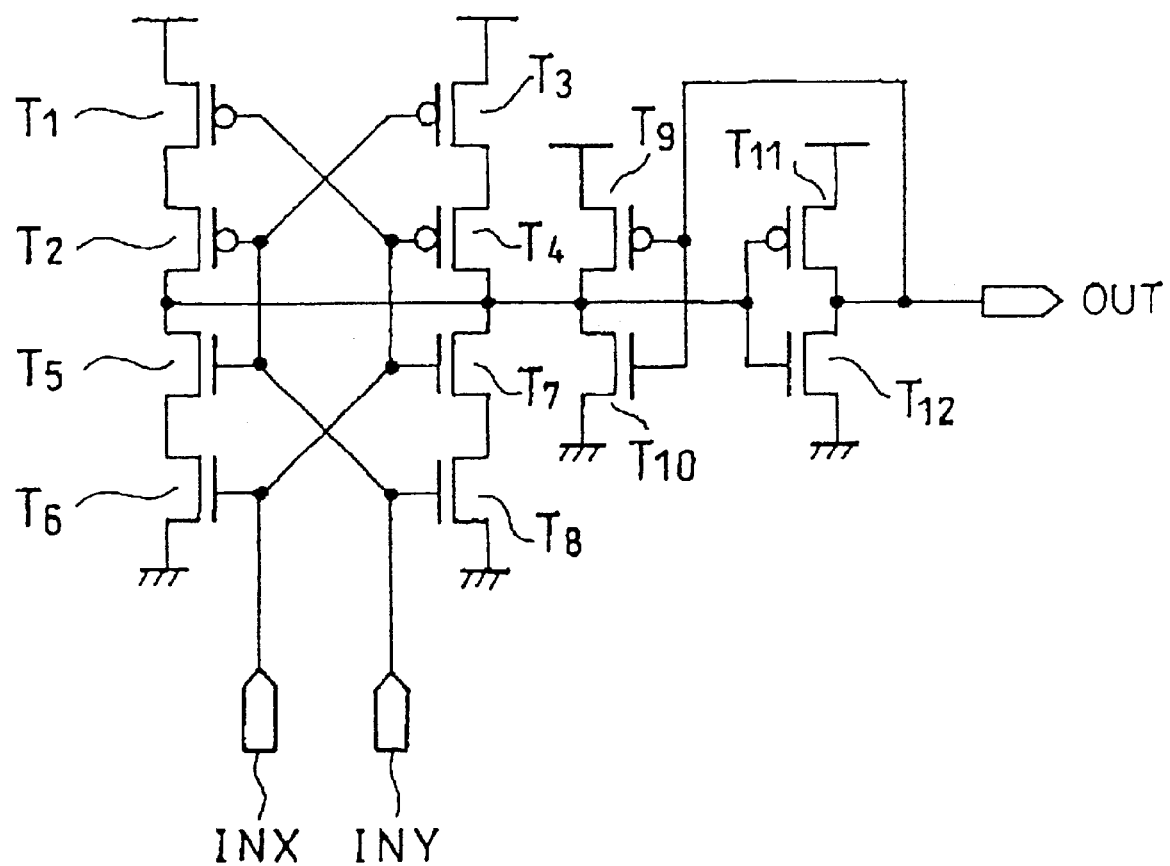
FIG. 5A is a circuit diagram illustrative of a first example of a flip-flop type receiver circuit provided in each of the basic blocks of FIG. 4.
FIG. 5B is a circuit diagram illustrative of a second example of a flip-flop type receiver circuit provided in each of the basic blocks of FIG. 4.
Figure 5:
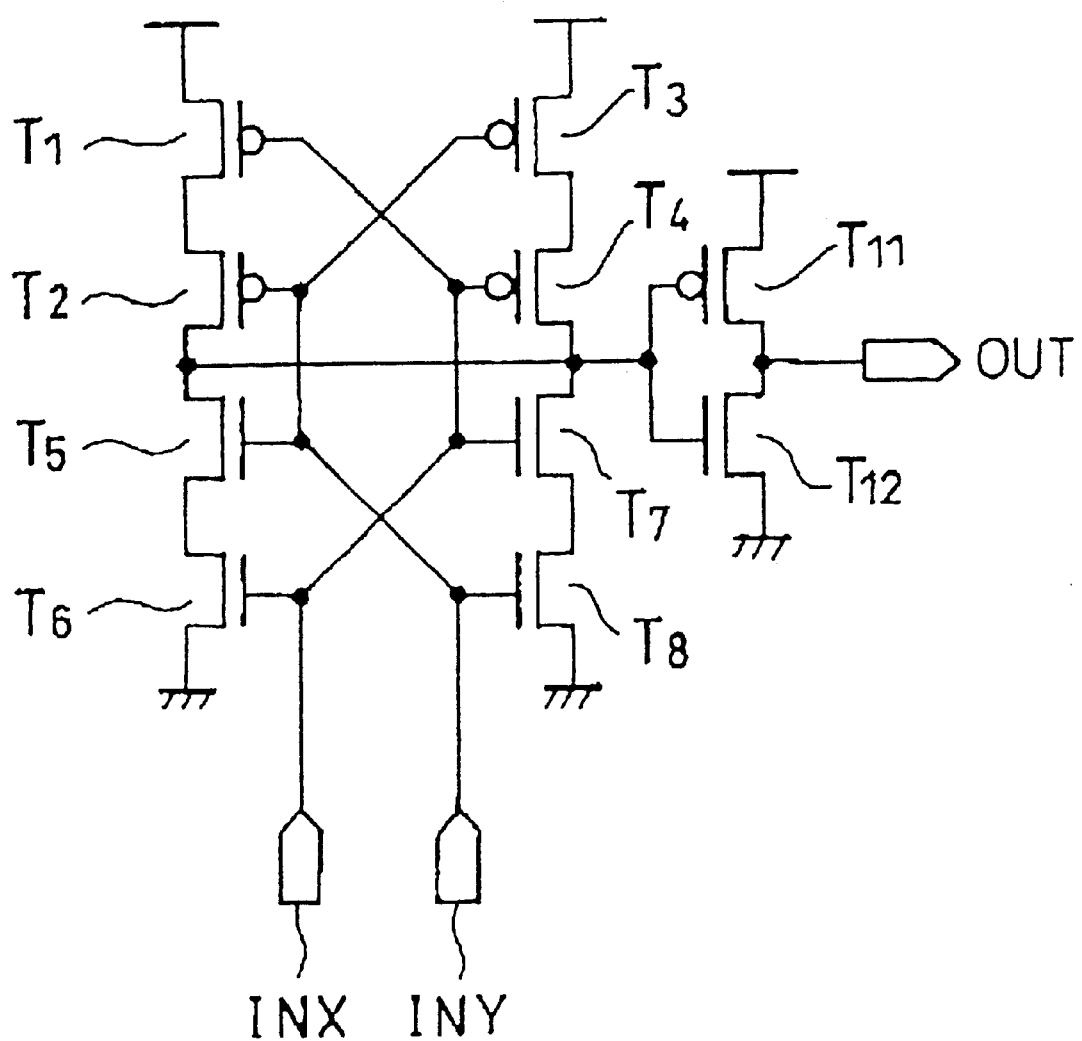

FIG. 5A is a circuit diagram illustrative of a first example of a flip-flop type receiver circuit provided in each of the basic blocks of FIG. 4. The flip-flop type receiver circuit comprises a circuit section and a holder section. The circuit section further comprises four p-channel MOS field effect transistors T1, T2, T3 and T4 and four n-channel MOS field effect transistors T5, T6, T7 and T8. The holder section also comprises two p-channel MOS field effect transistors T9 and T11 and two n-channel MOS field effect transistors T10 and T12. The flip-flop type receiver circuit has two input terminals INX and INY for receiving the first and second control signals INX and INY having been transmitted in X-direction and Y-direction. The flip-flop type receiver circuit has a single output terminal OUT. The detailed circuit configuration of the above first example of the flip-flop type receiver circuit is as follows. The p-channel MOS field effect transistors T1 and T2 and the n-channel MOS field effect transistors T5 and T6 are connected in series between a power voltage line and a ground line, wherein the p-channel MOS field effect transistors T1 and T2 are connected between the power voltage line and a first intermediate node whilst the n-channel MOS field effect transistors T5 and T6 are connected between the ground line and the first intermediate node. Gates of the p-channel MOS field effect transistor T1 and the n-channel MOS field effect transistor T6 are connected to the first input terminal INX for allowing the gates to receive inputs of the control signals INX having been transmitted in the X-direction. Gates of the p-channel MOS field effect transistor T2 and the n-channel MOS field effect transistor T5 are connected to the second input terminal INY for allowing the gates to receive inputs of the control signals INY having been transmitted in the Y-direction. The p-channel MOS field effect transistors T3 and T4 and the n-channel MOS field effect transistors T7 and T8 are connected in series between the power voltage line and the ground line, wherein the p-channel MOS field effect transistors T3 and T4 are connected between the power voltage line and a second intermediate node whilst the n-channel MOS field effect transistors T7 and T8 are connected between the ground line and the second intermediate node. Gates of the p-channel MOS field effect transistor T4 and the n-channel MOS field effect transistor T7 are connected to the first input terminal INX for allowing the gates to receive inputs of the control signals INX having been transmitted in the X-direction Gates of the p-channel MOS field effect transistor T3 and the n-channel MOS field effect transistor T8 are connected to the second input terminal INY for allowing the gates to receive inputs of the control signals INY having been transmitted in the Y-direction. The p-channel MOS field effect transistor T9 and the n-channel MOS field effect transistor T10 are connected in series between the power voltage line and the ground line, wherein the p-channel MOS field effect transistor T9 is connected between the power voltage line and a third intermediate node whilst the n-channel MOS field effect transistor T10 is connected between the ground line and the third intermediate node. Gates of the p-channel MOS field effect transistor T9 and the n-channel MOS field effect transistor T10 are connected to the output terminal OUT. The p-channel MOS field effect transistor T11 and the n-channel MOS field effect transistor T12 are connected in series between the power voltage line and the ground line, wherein the p-channel MOS field effect transistor T11 is connected between the power voltage line and the output terminal OUT whilst the n-channel MOS field effect transistor T12 is connected between the ground line and the output terminal OUT. Gates of the p-channel MOS field effect transistor T11 and the n-channel MOS field effect transistor T12 are connected to the first, second and third intermediate nodes.

It is also possible to modify the above flip-flop type receiving circuit if a dynamic value may be held. FIG. 5B is a circuit diagram illustrative of a second example of a flip-flop type receiver circuit provided in each of the basic blocks of FIG. 4. The difference of the second example of the flip-flop type receiver circuit from the first example thereof is in that the p-channel MOS field effect transistor T9 and the n-channel MOS field effect transistor T10 are not provided. Namely, the flip-flop type receiver circuit comprises a circuit section and a holder section. The circuit section further comprises four p-channel MOS field effect transistors T1, T2, T3 and T4 and four n-channel MOS field effect transistors T5, T6, T7 and T8. The holder section also comprises a single p-channel MOS field effect transistor T11 and a single n-channel MOS field effect transistor T12. The flip-flop type receiver circuit has two input terminals INX and INY for receiving the first and second control signals INX and INY having been transmitted in X-direction and Y-direction. The flip-flop type receiver circuit has a single output terminal OUT. The detailed circuit configuration of the above first example of the flip-flop type receiver circuit is as follows. The p-channel MOS field effect transistors T1 and T2 and the n-channel MOS field effect transistors T5 and T6 are connected in series between a power voltage line and a ground line, wherein the p-channel MOS field effect transistors T1 and T2 are connected between the power voltage line and a first intermediate node whilst the n-channel MOS field effect transistors T5 and T6 are connected between the ground line and the first intermediate node. Gates of the p-channel MOS field effect transistor T1 and the n-channel MOS field effect transistor T6 are connected to the first input terminal INX for allowing the gates to receive inputs of the control signals INX having been transmitted in the X-direction. Gates of the p-channel MOS field effect transistor T2 and the n-channel MOS field effect transistor T5 are connected to the second input terminal INY for allowing the gates to receive inputs of the control signals INY having been transmitted in the Y-direction. The p-channel MOS field effect transistors T3 and T4 and the n-channel MOS field effect transistors T7 and T8 are connected in series between the power voltage line and the ground line, wherein the p-channel MOS field effect transistors T3 and T4 are connected between the power voltage line and a second intermediate node whilst the n-channel MOS field effect transistors T7 and T8 are connected between the ground line and the second intermediate node. Gates of the p-channel MOS field effect transistor T4 and the n-channel MOS field effect transistor T7 are connected to the first input terminal INX for allowing the gates to receive inputs of the control signals INX having been transmitted in the X-direction. Gates of the p-channel MOS field effect transistor T3 and the n-channel MOS field effect transistor T8 are connected to the second input terminal INY for allowing the gates to receive inputs of the control signals INY having been transmitted in the Y-direction. The p-channel MOS field effect transistor T11 and the n-channel MOS field effect transistor T12 are connected in series between the power voltage line and the ground line, wherein the p-channel MOS field effect transistor T11 is connected between the power voltage line and the output terminal OUT whilst the n-channel MOS field effect transistor T12 is connected between the ground line and the output terminal OUT. Gates of the p-channel MOS field effect transistor T11 and the n-channel MOS field effect transistor T12 are connected to the first, second and third intermediate nodes.

Figure 6A:
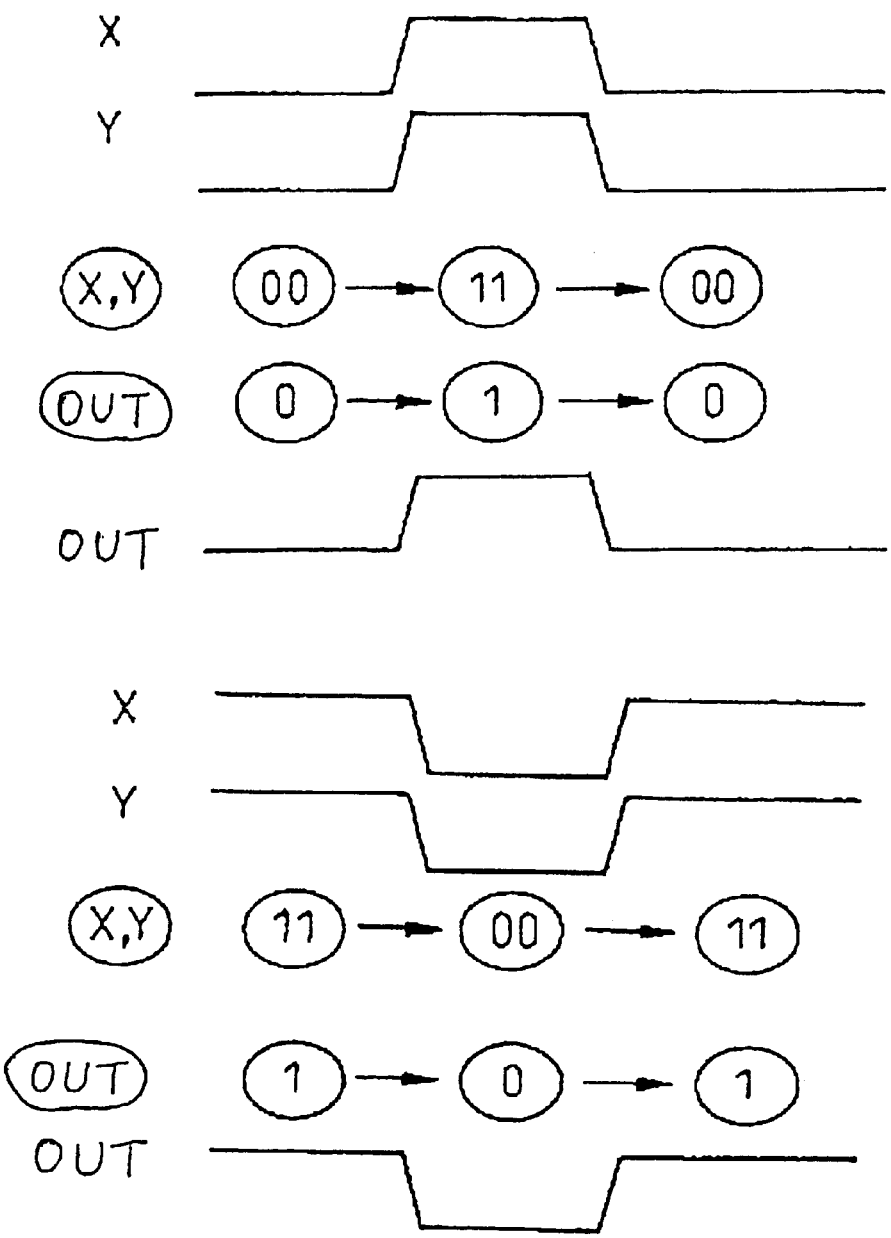
FIG. 6A is a diagram illustrative of an output signal waveform from a flip-flop type receiver circuit when first and second control signals having been transmitted in X-direction and Y-direction are concurrently inputted into the flip-flop type receiver circuit without any delay.
Figure 6B:
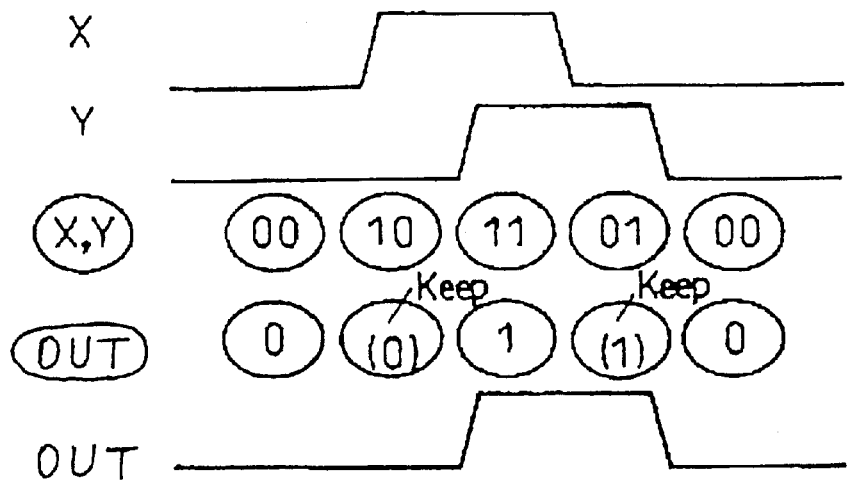
FIG. 6B is a diagram illustrative of an output signal waveform from a flip-flop type receiver circuit when the first control signal having been transmitted in X-direction is inputted into the flip-flop type receiver circuit before the second control signal having been transmitted in Y-direction is then inputted into the flip-flop type receiver circuit with a time delay.
Figure 6C:
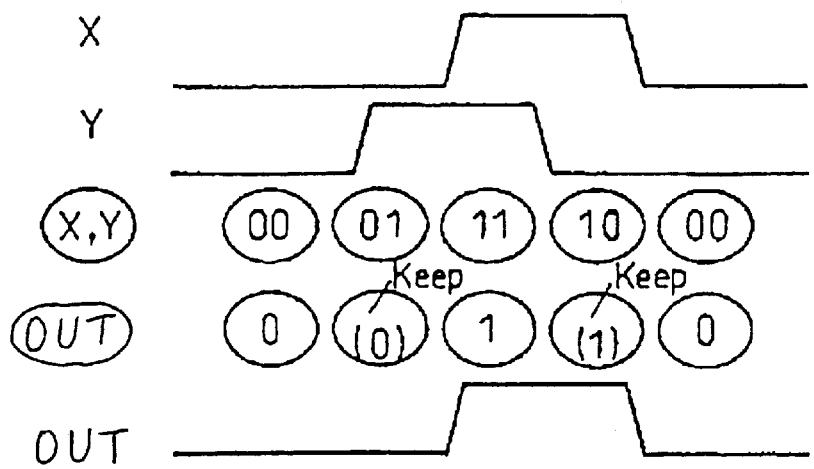
FIG. 6C is a diagram illustrative of an output signal waveform from a flip-flop type receiver circuit when the second control signal having been transmitted in Y-direction is inputted into the flip-flop type receiver circuit before the first control signal having been transmitted in X-direction is then inputted into the flip-flop type receiver circuit with a time delay.
Figure 6C:
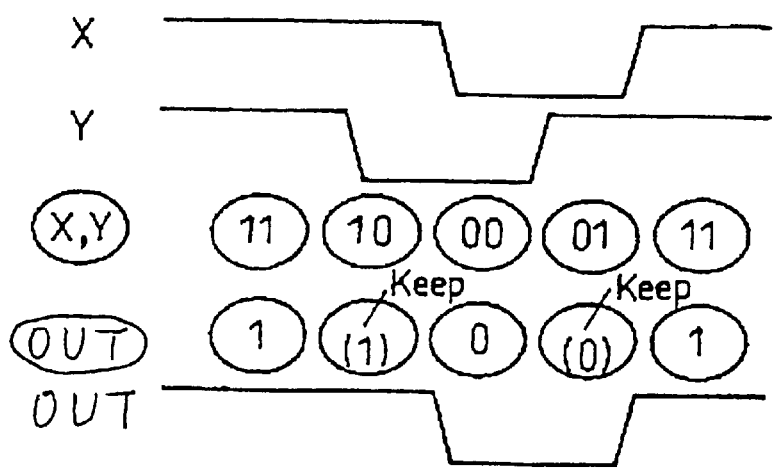

The following table 1 shows a truth table of operations of the receiver circuit of FIGS. 5A and 5B. FIGS. 6A through 6C are diagrams illustrative of operations of the receiver circuit of FIGS. 5A and 5B.

TABLE 1

| INX | INY | OUT |
|-----|-----|------|
| 0 | 0 | 0 |
| 0 | 1 | keep |
| 1 | 0 | keep |
| 1 | 1 | 1 |

FIG. 6A is a diagram illustrative of an output signal waveform from a flip-flop type receiver circuit when first and second control signals having been transmitted in X-direction and Y-direction are concurrently inputted into the flip-flop type receiver circuit without any delay. If the first and second control signals are in the low level "0", then the output signal from the receiver circuit is in the low level "0". If the first and second control signals become the high level "1", then the output signal from the receiver circuit is in the high level "1". If the first and second control signals return the low level "0", then the output signal from the receiver circuit also returns the low level "0". If the first and second control signals are in the high level "1", then the output signal from the receiver circuit is in the high level "1". If the first and second control signals become the low level "0", then the output signal from the receiver circuit also becomes the low level "0". If the first and second control signals return the high level "1", then the output signal from the receiver circuit also returns the high level "1".

FIG. 6B is a diagram illustrative of an output signal waveform from a flip-flop type receiver circuit when the first control signal having been transmitted in X-direction is inputted into the flip-flop type receiver circuit before the second control signal having been transmitted in Y-direction is then inputted into the flip-flop type receiver circuit with a time delay. If the first and second control signals are in the low level "0", then the output signal from the receiver circuit is in the low level "0". If the first control signal becomes high level "1" but the second control signal remains the low level "0", then the output signal from the receiver circuit is kept in the low level "0". If the second control signal becomes the high level "1" following to the first control signal having been in the high level "1", then the output signal from the receiver circuit becomes the high level "1". If the first control signal only becomes the low level "0" whilst the second control signal remains the high level, then the output signal from the receiver circuit is kept in the high level "1 ". If the second control signal becomes the low level "0" following to the first control signal having been in the low level "0", then the output signal from the receiver circuit becomes the high level "0". Accordingly, the output signal from the receiver circuit depends upon the second control signal having been inputted with the time delay. If the first and second control signals are in the high level "1", then the output signal from the receiver circuit is in the high level "1 ". If the first control signal becomes low level "0" but the second control signal remains in the high level "1", then the output signal from the receiver circuit is kept in the high level "1". If the second control signal becomes the low level "0" following to the first control signal having been in the low level "0 ", then the output signal from the receiver circuit becomes the low level "0". If the first control signal only becomes the high level "1" whilst the second control signal remains in the low level, then the output signal from the receiver circuit is kept in the low level "0". If the second control signal becomes the high level "1" following to the first control signal having been in the high level "1", then the output signal from the receiver circuit becomes the low level "1". Accordingly, the output signal from the receiver circuit depends upon the second control signal having been inputted with the time delay.

FIG. 6C is a diagram illustrative of an output signal waveform from a flip-flop type receiver circuit when the second control signal having been transmitted in Y-direction is inputted into the flip-flop type receiver circuit before the first control signal having been transmitted in X-direction is then inputted into the flip-flop type receiver circuit with a time delay. If the first and second control signals are in the low level "0", then the output signal from the receiver circuit is in the low level "0". If the second control signal becomes high level "1" but the first control signal remains the low level "0", then the output signal from the receiver circuit is kept in the low level "0". If the first control signal becomes the high level "1" following to the second control signal having been in the high level "1", then the output signal from the receiver circuit becomes the high level "1". If the second control signal only becomes the low level "0" whilst the first control signal remains the high level, then the output signal from the receiver circuit is kept in the high level "1". If the first control signal becomes the low level "0" following to the second control signal having been in the low level "0", then the output signal from the receiver circuit becomes the high level "0". Accordingly, the output signal from the receiver circuit depends upon the first control signal having been inputted with the time delay. If the first and second control signals are in the high level "1", then the output signal from the receiver circuit is in the high level "1". If the second control signal becomes low level "0" but the first control signal remains in the high level "1 ", then the output signal from the receiver circuit is kept in the high level "1". If the first control signal becomes the low level "0" following to the second control signal having been in the low level "0", then the output signal from the receiver circuit becomes the low level "0". If the second control signal only becomes the high level "1" whilst the first control signal remains in the low level, then the output signal from the receiver circuit is kept in the low level "0". If the first control signal becomes the high level "1" following to the second control signal having been in the high level "1", then the output signal from the receiver circuit becomes the low level "1". Accordingly, the output signal from the receiver circuit depends upon the first control signal having been inputted with the time delay.

Consequently, the output signal from the receiver circuit depends upon the control signal having been inputted with the time delay.

Figure 7:
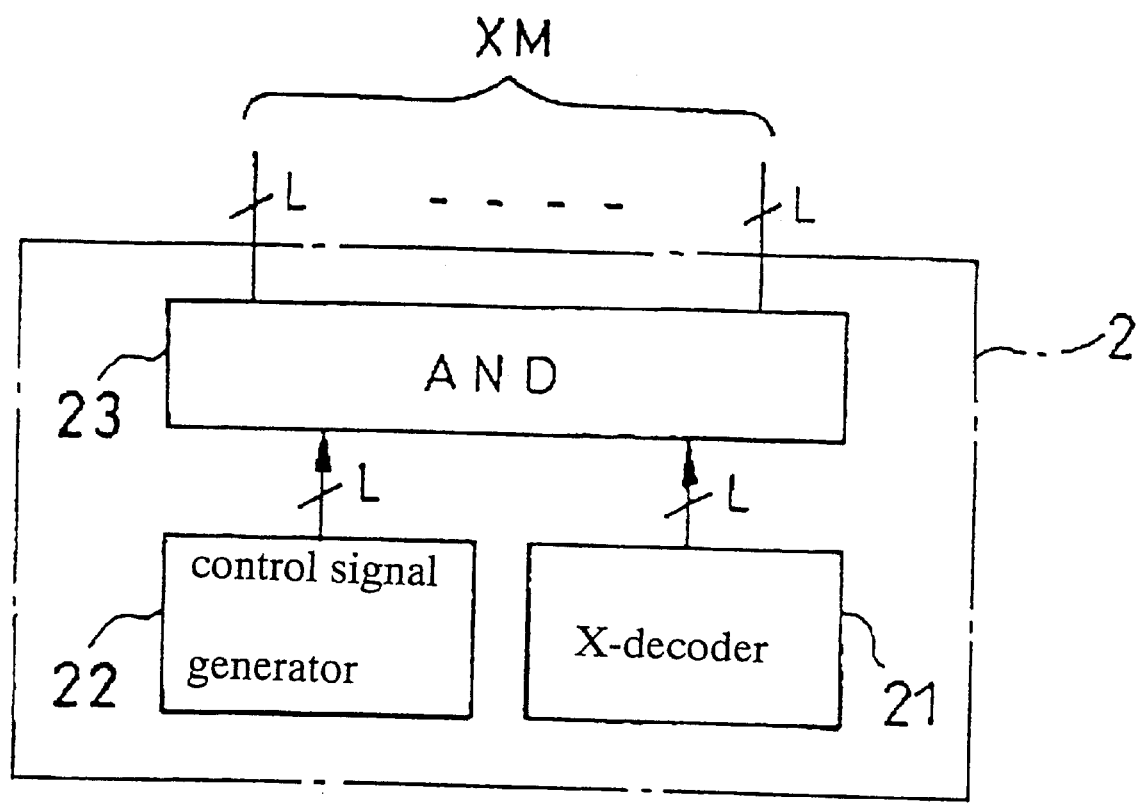
FIG. 7 is a block diagram illustrative of a first control signal output circuit for transmitting first control signals in X-direction in FIG. 3.

FIG. 7 is a block diagram illustrative of a first control signal output circuit for transmitting first control signals in X-direction in FIG. 3. The first control signal output circuit has a first block selective decoder 21 operating in synchronizing with the external clock signal CLK, a first control signal generator circuit 22 generating the number "L" of the first control signal in synchronizing with the external clock signal CLK, and an AND gate 23 connected to the first block selective decoder 21 and the first control signal generator circuit 22 for receiving output signals from the first block selective decoder 21 and the first control signal generator circuit 22 in order to accomplish AND-operation of those output signals.

Figure 8:
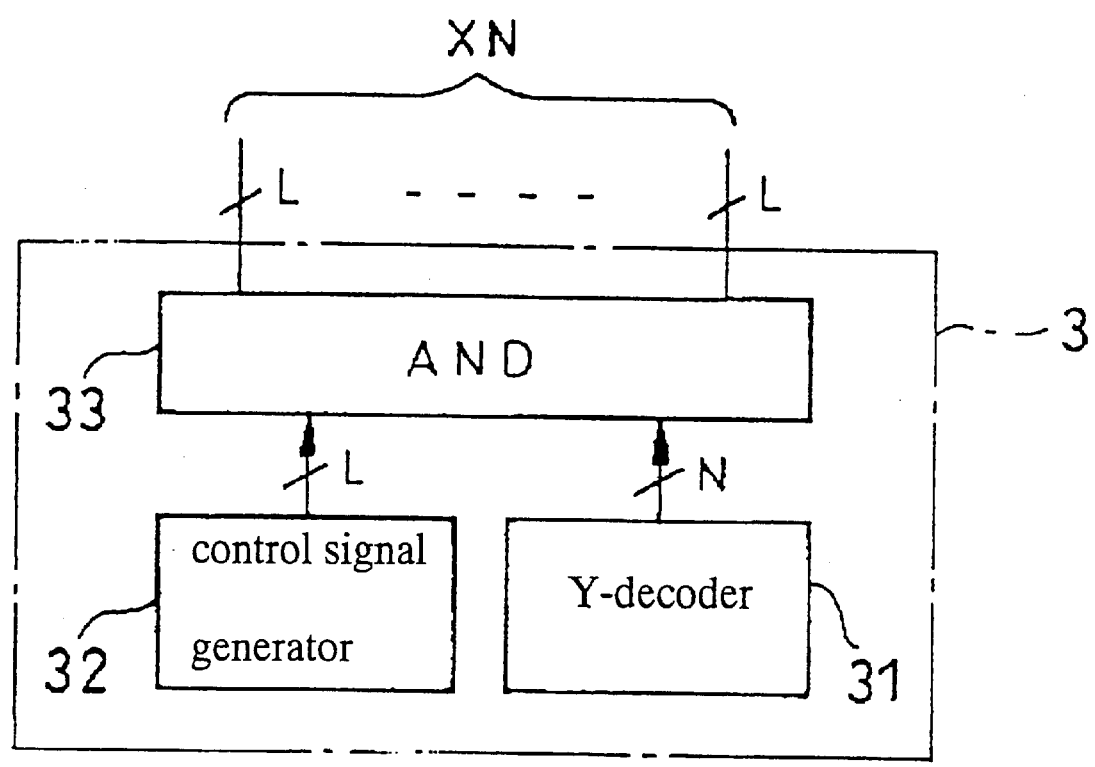
FIG. 8 is a block diagram illustrative of a second control signal output circuit for transmitting second control signals in Y-direction in FIG. 3.

FIG. 8 is a block diagram illustrative of a second control signal output circuit for transmitting second control signals in Y-direction in FIG. 3. The second control signal output circuit has a second block selective decoder 31 operating in synchronizing with the external clock signal CLK, a second control signal generator circuit 32 generating the number "L" of the second control signal in synchronizing with the external clock signal CLK, and an AND gate 33 connected to the second block selective decoder 31 and the second control signal generator circuit 32 for receiving output signals from the second block selective decoder 31 and the second control signal generator circuit 32 in order to accomplish AND-operation of those output signals.

Figure 9:
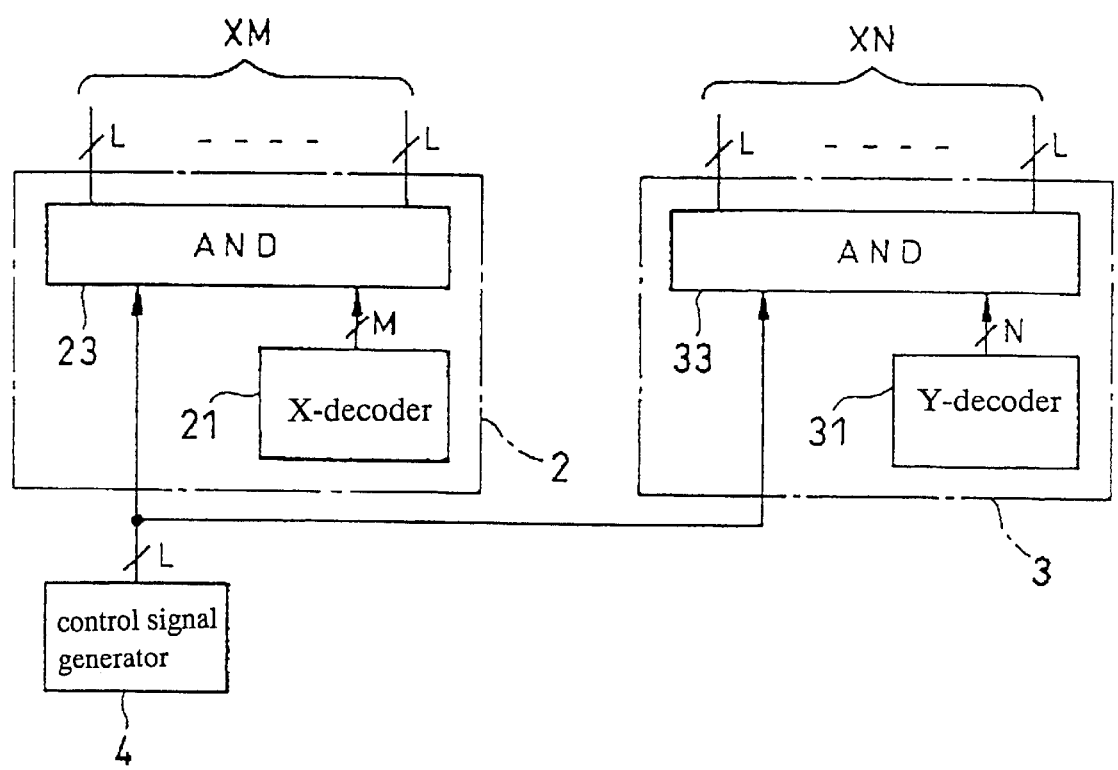
FIG. 9 is a block diagram illustrative of another example of first and second control signal output circuits for transmitting first and second control signals in X-direction and Y-direction in FIG. 3.

FIG. 9 is a block diagram illustrative of another example of first and second control signal output circuits for transmitting first and second control signals in X-direction and Y-direction in FIG. 3. The first control signal output circuit 2 has a first block selective decoder 21 operating in synchronizing with the external clock signal CLK, a single common control signal generator circuit 4 generating the number "L" of the control signal in synchronizing with the external clock signal CLK, and a first AND gate 23 connected to the first block selective decoder 21 and the single common control signal generator circuit 4 for receiving output signals from the first block selective decoder 21 and the single common control signal generator circuit 4 in order to accomplish AND-operation of those output signals. The second control signal output circuit 3 has a second block selective decoder 31 operating in synchronizing with the external clock signal CLK, the single common control signal generator circuit 4 generating the number "L" of the control signal in synchronizing with the external clock signal CLK, and a second AND gate 33 connected to the second block selective decoder 31 and the single common control signal generator circuit 4 for receiving output signals from the second block selective decoder 31 and the single common control signal generator circuit 4 in order to accomplish AND-operation of those output signals.

As illustrated in FIGS. 7 and 8, the first and second control signal generator circuits are individually provided in the first and second control signal output circuits 2 and 3 for generating the number "L" of the control signals for realizing accurate operations of the basic block 1. Alternatively, as illustrated in FIG. 9, the single common control signal generator circuit is provided for sending the control signal to the first and second block selective circuits 2 and 3, so that the first and second block selective signals including the same control signals are transmitted in the X-direction and Y-direction to the basic block to be selectively activated.

The number "L" of the first control signals including the block selective information are transmitted in the X-direction, whilst the number "L" of the second control signals including the block selective information are transmitted in the Y-direction. The number "L" pairs of the same first and second control signals are inputted into the number "L" of the receiver circuits 11, - - - 1L. The receiver circuit shown in FIGS. 5A and 5B operates as shown on Table 1 and in FIGS. 6A through 6C. The receiver circuit output signal depends upon delayed one of the first and second control signals, wherein the delayed one is inputted into the receiver circuit with the time delay.

Figure 10:
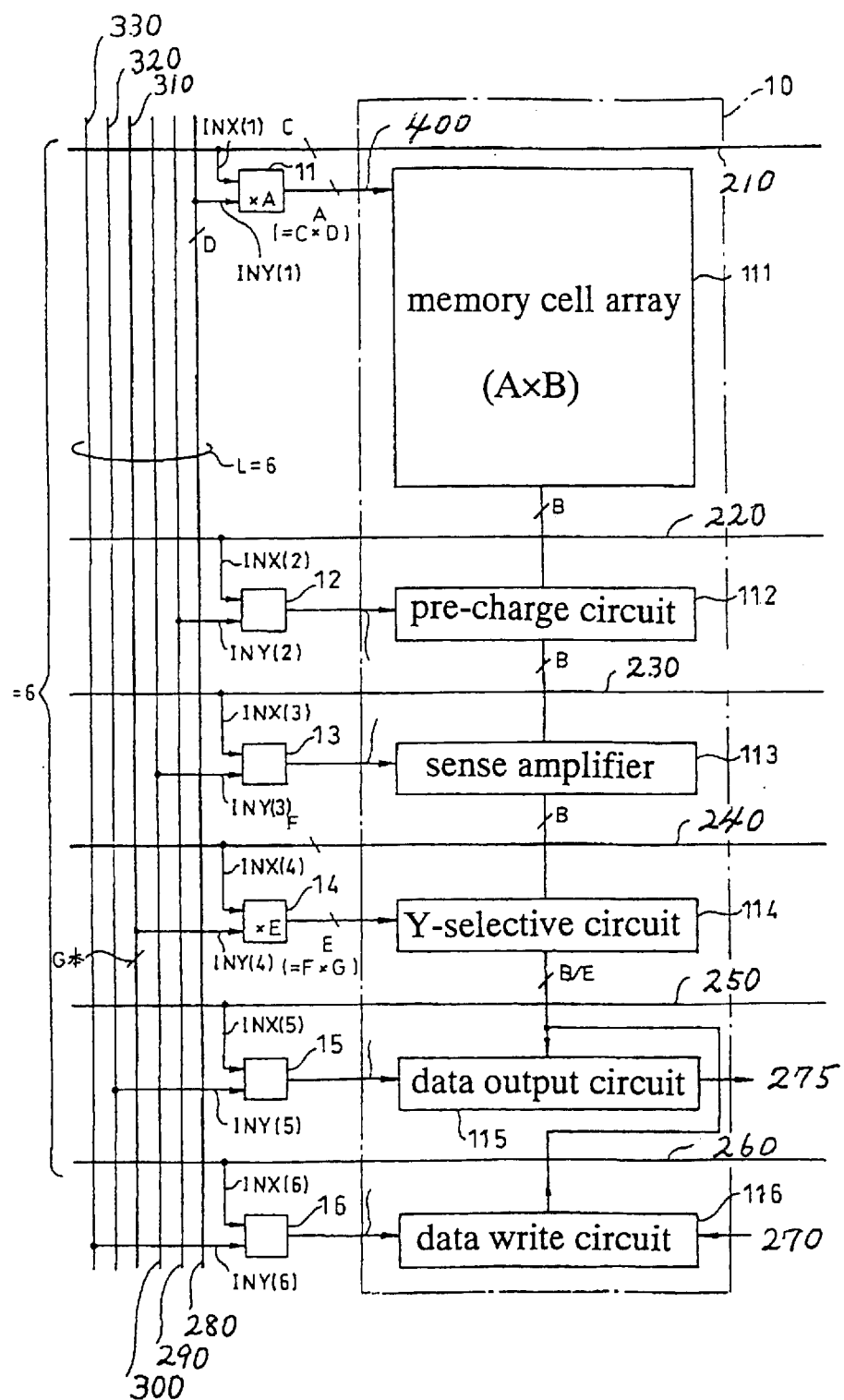
FIG. 10 is a circuit diagram illustrative of a circuit configuration of six flip-flop type receiver circuits and a single circuit block in each of a basic block of FIG. 4.

FIG. 10 is a circuit diagram illustrative of a circuit configuration of six flip-flop type receiver circuits and a single circuit block in each of a basic block of FIG. 4. Six flip-flop type receiver circuits 11, 12, 13, 14, 15 and 16 are provided to a single circuit block 10 in each of the basic block. The circuit block 10 has a single memory cell array 111 of A×B matrix. The memory cell array 111 is connected to a first flip-flop type receiver circuit 11 for receiving a sub-word signal 400. A word line 210 extends in X-direction. A pre-charge signal line 220 extends in X-direction. A sense amplifier enable signal line 230 extends in X-direction. A bit line 240 extends in X-direction. A read control signal line 250 extends in X-direction. A write control signal line 260 extends in X-direction. A write input/output line 270 extends in X-direction. A read input/output line 275 extends in X-direction. A word line 280 extends in Y-direction. A pre-charge signal line 290 extends in Y-direction. A sense amplifier enable signal line 300 extends in Y-direction. A bit line 310 extends in Y-direction. A read control signal line 320 extends in Y-direction. A write control signal line 330 extends in Y-direction. In addition to the memory cell array 111, the circuit block 10 also has the number "B" of a pre-charge circuit 112 which is connected to a second flip-flop type receiver circuit 12 for receiving a pre-charge signal 410. The circuit block 10 also has the number "B" of a sense amplifier circuit 113 which is connected to a third flip-flop type receiver circuit 13 for receiving a sense amplifier enable signal 420. The circuit block 10 also has the number "B" of a Y-selective circuit 114 which is connected to a fourth flip-flop type receiver circuit 14 for receiving selecting signals 430 transmitted on the number "E" of signal lines, so that one of the selecting signals 430 is activated to select one of E in Y-direction. The circuit block 10 also has the number "B/E" of a data output circuit 115 which is connected to a fifth flip-flop type receiver circuit 15 for receiving a selecting signal 440, wherein E is the number of signal lines on which selecting signals 430 are transmitted. The circuit block 10 also has the number "B/E" of a data write circuit 116 which is connected to a sixth flip-flop type receiver circuit 16 for receiving a write control signal 450. The data output circuit 115 is connected to the read input/output line 275 for transmitting the output data on the read input/output line 275. The data write circuit 116 is also connected to the write input/output line 270 for receiving write data transmitted on the write input/output line 270.

The number of the word lines 210 extending in X-direction is "C". The number of the word lines 280 extending in Y-direction is "D". The first flip-flop receiver circuit 11 is connected to the word lines 210 extending in X-direction for receiving the number "C" of inputs INX(1) transmitted on the word lines 210, and also connected to the word lines 280 extending in Y-direction for receiving the number "D" of inputs INY(1) transmitted on the word lines 280. The first flip-flop receiver circuit 11 is further connected to the memory cell array 111 for transmitting the number "A" of the sub-word signals 400 to the memory cell array 111, wherein "A" is the product of "C" and "D".

The second flip-flop receiver circuit 12 is connected to the pre-charge signal line 220 for receiving an input INX(2) transmitted on the pre-charge signal line 220 extending in X-direction, and also connected to the pre-charge signal line 290 for receiving an input INY(2) transmitted on the pre-charge signal line 290 extending in Y-direction. The second flip-flop receiver circuit 12 is further connected to the pre-charge circuit 112 for transmitting the pre-charge signal 410 to the pre-charge circuit 112. The pre-charge circuit 112 is also connected to the memory cell array 111 through a set of the number "B" of data lines.

The third flip-flop receiver circuit 13 is connected to the sense amplifier enable signal line 230 for receiving an input INX(3) transmitted on the sense amplifier enable signal line 230 extending in X-direction, and also connected to the sense amplifier enable signal line 300 for receiving an input INY(3) transmitted on the sense amplifier enable signal line 300 extending in Y-direction. The third flip-flop receiver circuit 13 is further connected to the sense amplifier circuit 113 for transmitting the sense amplifier enable signal 420 to the sense amplifier circuit 113. The sense amplifier circuit 113 is also connected to the pre-charge circuit 112 through a set of the number "B" of data lines.

The fourth flip-flop receiver circuit 14 is connected to the number "F" of bit line 240 for receiving the number "F" of inputs INX(4) transmitted on the number "F" of the bit line 240 extending in X-direction, and also connected to the number "G" of bit line 310 for receiving the number "G" of input INY(4) transmitted on the bit line 310 extending in Y-direction.

The fourth flip-flop receiver circuit 14 is further connected to the Y-selective circuit 114 for transmitting the number "E" of the selective signal 430 to the Y-selective circuit 114, wherein E is the product of F×G. The Y-selective circuit 114 is also connected to the sense amplifier circuit 113 through a set of the number "B" of data lines.

The fifth flip-flop receiver circuit 15 is connected to the read control signal line 250 for receiving an input INX(5) transmitted on the read control signal line 250 extending in X-direction, and also connected to the read control signal line 320 for receiving an input INY(5) transmitted on the read control signal line 320 extending in Y-direction. The fifth flip-flop receiver circuit 15 is further connected to the data output circuit 115 for transmitting the read control signal 440 to the data output circuit 115. The data output circuit 115 is also connected to the Y-selective circuit 114 through a set of the number "B/E" of data lines. The data output circuit 115 is also connected to the read input/output line 275 for outputting the read data through the read input/output line 275.

The sixth flip-flop receiver circuit 16 is connected to the write control signal line 260 for receiving an input INX(6) transmitted on the write control signal line 260 extending in X-direction, and also connected to the write control signal line 330 for receiving an input INY(6) transmitted on the write control signal line 330 extending in Y-direction. The sixth flip-flop receiver circuit 16 is further connected to the data write circuit 116 for transmitting the write control signal 450 to the data write circuit 116. The data output circuit 116 is also connected to the Y-selective circuit 114 through a set of the number "B/E" of data lines. The data write circuit 116 is also connected to the write input/output line 270 for receiving the write data through the write input/output line 270.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor integrated circuit having:
   a plurality of basic blocks, at least one of said basic blocks being selectively activated in accordance with at least two types of selective signals, and each of said plurality of basic blocks having at least a circuit block and at least a receiver circuit connected to said circuit block; and
   at least one signal generator connected to said plurality of basic blocks for generating said at least two types of selective signals, each of the selective signals including control signals having a same active level in order to transmit said at least two types of selective signals to said receiver circuit in an activated one of said basic blocks,
   wherein if said at least two types of selective signals which individually include said control signals are inputted into said receiver circuit with different timings, then said receiver circuit generates an output signal which maintains a level which is the same as a level of said control signals included in one of said at least two types of selective signals which changed said level later in time.

2. The semiconductor integrated circuit as claimed in claim 1, wherein said at least two types of said selective signals including said control signals are the same as each other in number, each said circuit block having receiver circuits equal in number to said selective signals, and each of said receiver circuits receives every types of said selective signals one by one.

3. The semiconductor integrated circuit as claimed in claim 2, wherein said receiver circuits comprise flip-flop type logic circuits.

4. The semiconductor integrated circuit as claimed in claim 1, wherein a plurality of said signal generators are provided, and each of said signal generators comprises a control signal generator circuit for generating said control signal, a block selecting decoder circuit for generating said selective signal and an AND-logic circuit connected to said control signal generator circuit for receiving said control signal and also connected to said block selecting decoder circuit for receiving said selective signal so that said AND-logic circuit outputs an AND-operation result as said selective signal including said control signal.

5. The semiconductor integrated circuit as claimed in claim 1, wherein a plurality of said signal generators and a single common control signal generator for generating said control signal are provided, and each of said signal generators comprises a block selecting decoder circuit for generating said selective signal and an AND-logic circuit connected to said single common control signal generator circuit for receiving said control signal and also connected to said block selecting decoder circuit for receiving said selective signal so that said AND-logic circuit outputs an AND-operation result as said selective signal including said control signal.

6. The semiconductor integrated circuit as claimed in claim 1, wherein said semiconductor integrated circuit is a dynamic random access memory.

7. The semiconductor integrated circuit as claimed in claim 6, wherein each of said basic blocks includes at least a memory cell array and a sense amplifier connected to said memory cell array for amplifying data of said memory cell array, said selective signals including a sense amplifier enable signal comprising sense amplifier enable X and sense amplifier enable Y as control signals having a same active logic level.

8. The semiconductor integrated circuit as claimed in claim 7, wherein each of said basic blocks further includes a data output circuit connected to said sense amplifier for receiving amplified read data from said sense amplifier to output said amplified read data, and a date write circuit connected to said sense amplifier for transmitting write data to said sense amplifier, said selective signals further including a read control signal comprising read control signal X and read control signal Y as control signals having a same logic level and a write control signal comprising a write control signal X and a write control signal Y as control signals having a same logic level.

9. The semiconductor integrated circuit as claimed in claim 8, wherein each of said basic blocks further includes a pre-charge circuit connected between said memory cell array and said sense amplifier for pre-charging bit lines of said memory cell arrays, and said selective signals further including, a pre-charge signal comprising pre-charge signal X and pre-charge signal Y as control signals having a same logic level.

10. The semiconductor integrated circuit as claimed in claim 1, wherein said control signals comprise digital signals.

11. A semiconductor integrated circuit having:
a plurality of basic blocks, at least one of said basic blocks being selectively activated in accordance with at least two types of selective signals, and each of said plurality of basic blocks having at least a circuit block and at least a receiver circuit connected to said circuit block; and
at least one signal generator connected to said plurality of basic blocks for generating said at least two types of selective signals, each of the selective signals including control signals having a same active level in order to transmit said at least two types of selective signals to said receiver circuit in an activated one of said basic blocks,
wherein if said receiver circuit receives said at least two types of selective signals which individually include said control signals having the same level as each other, then said receiver circuit generates an output signal having the same level as said control signal, and if said receiver circuit receives said at least two types of selective signals which individually include said control signals having different levels from each other, then said receiver circuit generates the output signal having the same level as most recently received control signals which had the same level as each other.

12. The semiconductor integrated circuit as claimed in claim 11, wherein said at least two types of said selective signals including said control signals are the same as each other in number, each said circuit block having receiver circuits equal in number to said selective signals, and each of said receiver circuits receives every types of said selective signals one by one.

13. The semiconductor integrated circuit as claimed in claim 12, wherein said receiver circuits comprise are of flip-flop type logic circuits.

14. The semiconductor integrated circuit as claimed in claim 11, wherein a plurality of said signal generators are provided, and each of said signal generators comprises a control signal generator circuit for generating said control signal, a block selecting decoder circuit for generating said selective signal and an AND-logic circuit connected to said control signal generator circuit for receiving said control signal and also connected to said block selecting decoder circuit for receiving said selective signal so that said AND-logic circuit outputs an AND-operation result as said selective signal including said control signal.

15. The semiconductor integrated circuit as claimed in claim 11, wherein a plurality of said signal generators and a single common control signal generator for generating said control signal are provided, and each of said signal generators comprises a block selecting decoder circuit for generating said selective signal and an AND-logic circuit connected to said single common control signal generator circuit for receiving said control signal and also connected to said block selecting decoder circuit for receiving said selective signal so that said AND-logic circuit outputs an AND-operation result as said selective signal including said control signal.

16. The semiconductor integrated circuit as claimed in claim 11, wherein said semiconductor integrated circuit is a dynamic random access memory.

17. The semiconductor integrated circuit as claimed in claim 16, wherein each of said basic blocks includes at least a memory cell array and a sense amplifier connected Lo said memory cell array for amplifying data of said memory cell array, said selective signals including a sense amplifier enable signal comprising sense amplifier enable X and sense amplifier enable Y as control signals having a same active logic level.

18. The semiconductor integrated circuit as claimed in claim 17, wherein each of said basic blocks further includes a data output circuit connected to said sense amplifier for receiving amplified read data from said sense amplifier to output said amplified read data, and a date write circuit connected to said sense amplifier for transmitting write data to said sense amplifier, said selective signals further including a read control signal comprising read control signal X and read control signal Y as control signals having a same logic level and a write control signal comprising a write control signal X and a write control signal Y as control signals having a same logic level.

19. The semiconductor integrated circuit as claimed in claim 18, wherein each of said basic blocks further includes a pre-charge circuit connected between said memory cell array and said sense amplifier for pre-charging bit lines of said memory cell arrays, and said selective signals further including a pre-charge signal comprising pre-charge signal X and pre-charge signal Y as control signals having a same logic level.

20. The semiconductor integrated circuit as claimed in claim 11, wherein said control signals comprise digital signals.

21. A semiconductor integrated circuit comprising:

a plurality of basic blocks, each comprising a circuit block and a receiver circuit connected to said circuit block, the receiver circuit receiving as inputs at least two types of selective signals and producing as an output an enable signal to the circuit block, wherein each said basic block is selectively activated based on logic levels of the selective signals;

a least one signal generator which produces said at least two types of selective signals, each of the selective signals comprising a plurality of control signals which have a same active logic level as one another, wherein each of the plurality of control signals must be at the active logic level to activate a given said basic block;

wherein in each said basic block, the receiver circuit changes a value of the enable signal to the circuit block only when the control signals belonging to a given said selective signal are at a same logic level.

22. The semiconductor integrated circuit of claim 21, wherein a logic level of the enable signal generated by the receiver circuit is the same as a common logic level most recently held simultaneously by each of the received control signals.

23. The semiconductor integrated circuit of claim 21, wherein each said receiver circuit comprises flip-flop type logic circuits.

24. The semiconductor integrated circuit as claimed in claim 21, wherein said semiconductor integrated circuit is a dynamic random access memory.

25. The semiconductor integrated circuit as claimed in claim 24, wherein each of said basic blocks includes at least a memory cell array and a sense amplifier connected to said memory cell array for amplifying data of said memory cell array, said selective signals including a sense amplifier enable signal comprising sense amplifier enable X and sense amplifier enable Y as control signals having a same active logic level.

26. The semiconductor integrated circuit as claimed in claim 25, wherein each of said basic blocks further includes a data output circuit connected to said sense amplifier for receiving amplified read data from said sense amplifier to output said amplified read data, and a date write circuit connected to said sense amplifier for transmitting write data to said sense amplifier, said selective signals further including a read control signal comprising read control signal X and read control signal Y as control signals having a same logic level and a write control signal comprising a write control signal X and a write control signal Y as control signals having a same logic level.

27. The semiconductor integrated circuit as claimed in claim 26, wherein each of said basic blocks further includes a pre-charge circuit connected between said memory cell array and said sense amplifier for pre-charging bit lines of said memory cell arrays, and said selective signals further including, a pre-charge signal comprising pre-charge signal X and pre-charge signal Y as control signals having a same logic level.

* * * * *